(12) United States Patent
Tsukamoto et al.

(10) Patent No.: US 11,733,188 B2
(45) Date of Patent: Aug. 22, 2023

(54) ANALYZER AND IMAGE PROCESSING METHOD

(71) Applicant: JEOL Ltd., Tokyo (JP)

(72) Inventors: Kazunori Tsukamoto, Tokyo (JP); Shigeru Honda, Tokyo (JP)

(73) Assignee: JEOL Ltd., Tokyo (JP)

( * ) Notice: Subject to any disclaimer, the term of this patent is extended or adjusted under 35 U.S.C. 154(b) by 72 days.

(21) Appl. No.: 17/591,803

(22) Filed: Feb. 3, 2022

(65) Prior Publication Data
US 2022/0244202 A1 Aug. 4, 2022

(30) Foreign Application Priority Data
Feb. 4, 2021 (JP) .................... 2021-016519

(51) Int. Cl.
*G01N 23/2252* (2018.01)
*H01J 37/22* (2006.01)

(52) U.S. Cl.
CPC ........ *G01N 23/2252* (2013.01); *H01J 37/222* (2013.01)

(58) Field of Classification Search
CPC ............... H01J 37/222; H01J 2237/221; H01J 2237/2809; G01N 23/2252; G01N 2223/401; G01N 2223/402; G01N 2223/605; G01N 2223/418; G06T 7/33; G06T 2207/10116; G06T 2207/20016; G06T 2207/10056; G06T 2207/20021

USPC .................................. 250/306, 307
See application file for complete search history.

(56) References Cited

U.S. PATENT DOCUMENTS

| | | | |
|---|---|---|---|
| 2007/0274593 A1* | 11/2007 | Tsuneta ................ | G06T 7/0004 382/192 |
| 2012/0181425 A1 | 7/2012 | Oohashi | |
| 2013/0250144 A1* | 9/2013 | Takayama ............. | H04N 5/265 348/239 |

FOREIGN PATENT DOCUMENTS

JP 2012149910 A 8/2012

* cited by examiner

*Primary Examiner* — Kiet T Nguyen
(74) *Attorney, Agent, or Firm* — The Webb Law Firm

(57) ABSTRACT

In an analyzer, an image processing unit performs processing of: dividing a measurement image into a plurality of partial measurement images, and dividing a reference image into a plurality of partial reference images; calculating a positional deviation amount of each of the partial measurement images relative to a corresponding partial reference image among the partial reference images; determining whether the positional deviation amount is a threshold or less; and correcting positional deviation of the measurement image based on the positional deviation amounts of the plurality of partial measurement images when the image processing unit has determined that the positional deviation amount is not the threshold or less.

6 Claims, 16 Drawing Sheets

| | WDS#1 | WDS#2 | WDS#3 | WDS#4 | WDS#5 |
|---|---|---|---|---|---|
| FIRST TIME | A | B | C | D | E |
| SECOND TIME | A | B | C | D | F |
| THIRD TIME | A | G | C | D | F |
| FOURTH TIME | A | G | C | D | E | ed
ANALYZER AND IMAGE PROCESSING METHOD

CROSS-REFERENCE TO RELATED APPLICATION

This application claims priority to Japanese Patent Application No. 2021-016519 filed Feb. 4, 2021, the disclosure of which is hereby incorporated by reference in its entirety.

BACKGROUND OF THE INVENTION

Field of the Invention

The present invention relates to an analyzer and an image processing method.

Description of Related Art

An electron probe micro-analyzer (EPMA) is known, which analyzes a specimen by applying an electron beam to the surface of the specimen and spectrally detecting a characteristic X-ray emitted from the specimen.

The EPMA is normally equipped with a plurality of wavelength dispersive X-ray spectrometers (WDS).

In a measurement using the wavelength dispersive X-ray spectrometer to acquire an X-ray map (element distribution map), a plurality of elements cannot be measured simultaneously using one spectrometer. Therefore, in a case of performing a measurement to acquire an X-ray map using the EPMA, a number of elements exceeding a number of spectrometers included in the analyzer cannot be measured simultaneously. In other words, if a number of elements to be analyzed exceeds a number of spectrometers, the measurement thereof must be performed separately multiple times.

However, in a plurality of X-ray maps acquired separately multiple times, a positional deviation may be generated among the X-ray maps due to the drift of the specimen and the like. If a positional deviation is generated among the X-ray maps, the correlation of the elements cannot be correctly analyzed in the phase analysis, for example.

To prevent this, according to JP-A-2012-149910, in a case where data of each X-ray image (X-ray map) on a same region of a specimen is acquired and stored at different timings, by using an EPMA: an electron image data based on detected secondary electrons or back-scattered electrons is also acquired for the region at each timing; then a positional deviation amount is calculated by comparing the electron image data acquired at different timings; and based on the calculated positional deviation amount, a region that commonly exists in the data of each X-ray image acquired at different timings is extracted.

Compared with an X-ray image, a secondary electron image and a back-scattered electron image include more information from their surfaces, and have higher resolutions. Therefore, in the processing method of JP-A-2012-149910 the same region can be accurately extracted from the X-ray images acquired at different timings.

As described above, it is desirable for an analyzer to accurately correct the positional deviation among the images acquired at different timings.

SUMMARY OF THE INVENTION

According to a first aspect of the invention, there is provided an analyzer including:

an analyzer main body that measures a specimen; and
an image processing unit that processes images based on a result of measurement of the specimen,
the image processing unit performing processing of:
acquiring a reference image which is obtained by measuring an analysis target region of the specimen by the analyzer main body;
acquiring a measurement image which is obtained by measuring the analysis target region by the analyzer main body;
dividing the measurement image into a plurality of partial measurement images, and dividing the reference image into a plurality of partial reference images;
calculating a positional deviation amount of each of the partial measurement images relative to a corresponding partial reference image among the partial reference images;
determining whether or not the positional deviation amount is a threshold or less; and
correcting positional deviation of the measurement image based on the positional deviation amounts of the plurality of partial measurement images when the image processing unit has determined that the positional deviation amount is not the threshold or less,
the processing of dividing, the processing of calculating the positional deviation amount, the processing of determining, and the processing of correcting the positional deviation being repeated until the image processing unit determines that the positional deviation amount is the threshold or less, and
the processing of dividing for an Mth time including processing of:
determining whether or not a size of each of the partial measurement images in the processing of dividing for an M−1th time is a reference size or less;
making a size of each of the partial measurement images in the processing of dividing for the Mth time to be smaller than the size of each of the partial measurement images in the processing of dividing for the M−1th time when the image processing unit has determined that the size of each of the partial measurement images for the M−1th time is not the reference size or less; and
making an overlapping amount of adjacent partial measurement images among the plurality of partial measurement images to be larger than the overlapping amount in the processing of dividing for the M−1th time when the image processing unit has determined that the size of each of the partial measurement images is the reference size or less.

According to a second aspect of the invention, there is provided an image processing method including steps of:
acquiring a reference image by measuring an analysis target region of a specimen by using an analyzer;
acquiring a measurement image by measuring the analysis target region by using the analyzer;
dividing the measurement image into a plurality of partial measurement images, and dividing the reference image into a plurality of partial reference images;
calculating a positional deviation amount of each of the partial measurement images relative to a corresponding partial reference image among the partial reference images;
determining whether or not the positional deviation amount is a threshold or less; and
correcting positional deviation of the measurement image based on the positional deviation amounts of the plurality of partial measurement images when it has been determined that the positional deviation amount is not the threshold or less, the step of dividing, the step of calculating the positional deviation amount, the step of determining and the step of correcting the positional deviation being repeated until it is determined that the positional deviation amount is the threshold or less, and the step of dividing for an Mth time including:

determining whether or not a size of each of the partial measurement images in the step of dividing for an M−1th time is a reference size or less;

making a size of each of the partial measurement images in the step of dividing for the Mth time to be smaller than the size of each of the partial measurement images in the step of dividing for the M−1th time when it has been determined that the size of each of the partial measurement images is not the reference size or less; and making an overlapping amount of adjacent partial measurement images among the partial measurement images to be larger than the overlapping amount in the step of dividing for the M−1th time when it has been determined that the size of each of the partial measurement images is the reference size or less.

DESCRIPTION OF THE INVENTION

Figure 1:
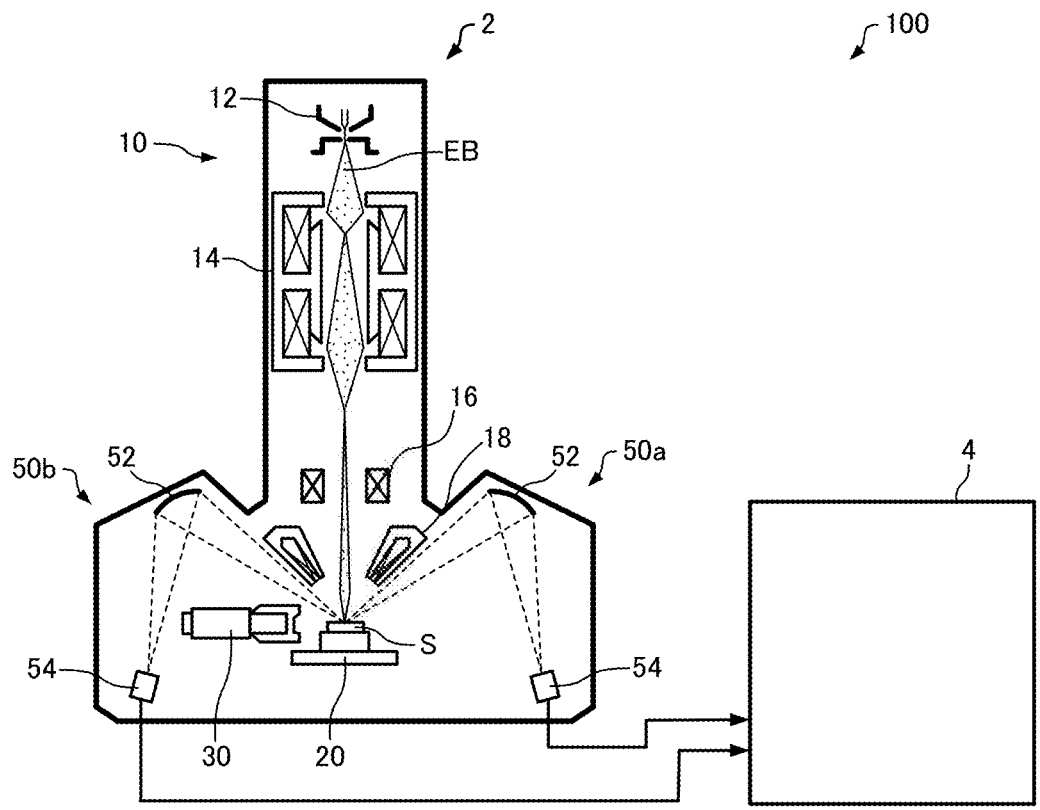
FIG. 1 is a diagram illustrating a configuration of an analyzer according to an embodiment of the invention.

According to an embodiment of the invention, there is provided an analyzer including:

an analyzer main body that measures a specimen; and an image processing unit that processes images based on a result of measurement of the specimen, the image processing unit performing processing of:

acquiring a reference image which is obtained by measuring an analysis target region of the specimen by the analyzer main body;

acquiring a measurement image which is obtained by measuring the analysis target region by the analyzer main body;

dividing the measurement image into a plurality of partial measurement images, and dividing the reference image into a plurality of partial reference images;

calculating a positional deviation amount of each of the partial measurement images relative to a corresponding partial reference image among the partial reference images;

determining whether or not the positional deviation amount is a threshold or less; and correcting positional deviation of the measurement image based on the positional deviation amounts of the plurality of partial measurement images when the image processing unit has determined that the positional deviation amount is not the threshold or less, the processing of dividing, the processing of calculating the positional deviation amount, the processing of determining, and the processing of correcting the positional deviation being repeated until the image processing unit determines that the positional deviation amount is the threshold or less, and the processing of dividing for an Mth time including processing of:

determining whether or not a size of each of the partial measurement images in the processing of dividing for an M−1th time is a reference size or less;

making a size of each of the partial measurement images in the processing of dividing for the Mth time to be smaller than the size of each of the partial measurement images in the processing of dividing for the M−1th time when the image processing unit has determined that the size of each of the partial measurement image for the M−1th time is not the reference size or less; and making an overlapping amount of adjacent partial measurement images among the plurality of partial measurement images to be larger than the overlapping amount in the processing of dividing for the M−1th time when the image processing unit has determined that the size of each of the partial measurement images for the M−1th time is the reference size or less.

According to this analyzer, the image processing unit corrects positional deviation of the measurement image based on the positional deviation amounts of a plurality of partial measurement images, hence not only the positional deviation in one direction, but also enlargement/reduction, distortion and the like can be corrected. Therefore with this analyzer, the positional deviations between the reference image and the measurement image, acquired at different timings, can be accurately corrected.

According to an embodiment of the invention, there is provided an image processing method including steps of:

acquiring a reference image by measuring an analysis target region of a specimen by using an analyzer;

acquiring a measurement image by measuring the analysis target region by using the analyzer;

dividing the measurement image into a plurality of partial measurement images, and dividing the reference image into a plurality of partial reference images;

calculating a positional deviation amount of each of the partial measurement images relative to a corresponding partial reference image among the partial reference images;

determining whether or not the positional deviation amount is a threshold or less; and correcting positional direction of the measurement image based on the positional deviation amounts of the plurality of partial measurement images when it has been determined that the positional deviation amount is not the threshold or less, the step of dividing, the step of calculating the positional deviation amount, the step of determining, and the step of correcting the positional deviation being repeated until it is determined that the positional deviation amount is the threshold or less, and the step of dividing for an Mth time including:

determining whether or not a size of each of the partial measurement images in the step of dividing for an M−1th time is a reference size or less;

making a size of each of the partial measurement images in the step of dividing for the Mth time to be smaller than the size of each of the partial measurement images in the step of dividing for the M−1th time when it has been determined that the size of each of the partial measurement images is not the reference size or less; and making an overlapping amount of adjacent partial measurement images among the partial measurement images to be larger than the overlapping amount in the step of dividing for the M−1th time when it has been determined that the size of each of the partial measurement images is the reference size or less.

According to this image processing method, the positional deviation of the measurement image is corrected based on the positional deviation amounts of a plurality of partial measurement images, hence not only the positional deviation in one direction, but also enlargement/reduction, distortion and the like can be corrected. Therefore in this image processing method, the positional deviations between the reference image and the measurement image, acquired at different timings, can be accurately corrected.

Preferred embodiments of the invention are described in detail below with reference to the drawings. It is noted that the following embodiments do not unduly limit the scope of the invention as stated in the claims. In addition, all of the components described in the following embodiments are not necessarily essential requirements of the invention.

1. Analyzer

Figure 2:
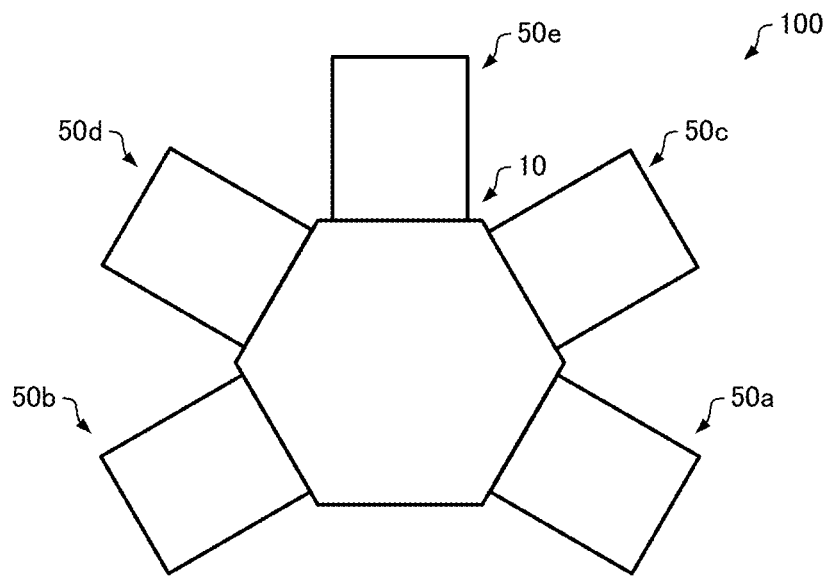
FIG. 2 is a diagram illustrating a configuration of an analyzer according to an embodiment of the invention.

An analyzer according to an embodiment of the invention will be described first, with reference to the drawings. FIG. 1 and FIG. 2 are diagrams illustrating a configuration of the analyzer 100 according to an embodiment of the invention. The analyzer 100 is an EPMA equipped with wavelength dispersive X-ray spectrometers (WDSs). The analyzer 100 may be a scanning electron microscope equipped with WDSs.

As illustrated in FIG. 1, the analyzer 100 includes an analyzer main body 2 and an image processor 4. The analyzer main body 2 includes an electron optical system 10, a specimen stage 20, an electron detector 30, a WDS 50a, a WDS 50b, a WDS 50c, a WDS 50d, and a WDS 50e. In FIG. 2, only the electron optical system 10 and five WDSs are illustrated for convenience.

The analyzer main body 2 measures a specimen S. By the analyzer main body 2 measuring the specimen S, an electron image and an X-ray image can be acquired. The electron image is an image acquired by detecting electrons emitted from the specimen S, and is a back-scattered electron image or a secondary electron image, for example. The X-ray image is an image acquired by detecting an X-ray emitted from the specimen S, and is an X-ray map (element distribution map), for example.

The electron optical system 10 forms an electron probe constituted of focused electron beam EB. The electron optical system 10 includes an electron gun 12, a focusing lens 14, a deflector 16 and an objective lens 18.

The electron gun 12 generates an electron beam EB. The electron gun 12 emits the electron beam EB, which was accelerated by a predetermined accelerating voltage, toward the specimen S.

The focusing lens 14 is a lens to focus the electron beam EB emitted from the electron gun 12. The deflector 16 deflects the electron beam EB two-dimensionally. By deflecting the electron beam EB using the deflector 16, the specimen S can be scanned with the electron probe. The objective lens 18 is a lens for focusing the electron beam EB on the specimen S. The electron probe can be formed by focusing the electron beam EB using the focusing lens 14 and the objective lens 18.

The specimen stage 20 supports the specimen S. The specimen S is placed on the specimen stage 20. The specimen stage 20 includes a moving mechanism (not illustrated) to move the specimen S. By moving the specimen S on the specimen stage 20, the position on the specimen S to which the electron beam EB is applied, can be changed.

In the analyzer 100, the specimen S may be scanned with the electron probe by deflecting the electron beam EB using the deflector 16, or the specimen S may be scanned with the electron probe by moving the specimen S on the specimen stage 20.

The electron detector 30 is a detector for detecting electrons emitted from the specimen S. An electron image can be acquired by detecting the electrons emitted from the specimen S using the electron detector 30. The electron detector 30 may be a back-scattered electron detector that detects back-scattered electrons, or a secondary electron detector that detects secondary electrons. In other words, the electron image may be either a back-scattered electron image or a secondary electron image.

The WDS 50a includes a spectroscopic element (spectroscopic crystal) 52 and an X-ray detector 54. In the WDS 50a, a characteristic X-ray generated from the specimen S is spectrally dispersed by the spectroscopic element 52, and the spectrally dispersed X-ray is detected by the X-ray detector 54.

The spectroscopic element 52 is a spectroscopic crystal for spectrally dispersing light using the diffraction phenomenon of X-rays. The WDS 50a includes a plurality of spectroscopic elements 52 of which crystal plane intervalues are mutually different. In other words, the plurality of spectroscopic elements 52 have mutually different spectroscopic wavelength ranges. The spectroscopic elements 52, PET, LiF, TAP, LDE or the like, may be used. The X-ray detector 54 detects a characteristic X-ray spectrally dispersed by the spectroscopic element 52.

As illustrated in FIG. 2, the analyzer main body 2 includes the WDS 50a, WDS 50b, WDS 50c, WDS 50d and WDS 50e. Each of these five WDSs includes a plurality of spectroscopic elements 52 and the X-ray detector 54. Thereby the analyzer 100 can perform the WDS analysis in a wide spectroscopic wavelength range. Further, the five WDSs can simultaneously detect X-rays having mutually different energies, therefore five X-ray maps can be acquired simultaneously.

The X-ray map (element distribution map) is generated by measuring the intensity of an X-ray unique to each element, while scanning the specimen S with the electron probe, and visualizing the difference of the intensity of the X-ray (counting rate) at each measurement point on the specimen S.

A number of WDSs included in the analyzer main body 2 is not especially limited.

In the analyzer main body 2, the electron optical system 10 forms the electron probe, and the specimen S is scanned with this electron probe. By scanning the specimen S with the electron probe, secondary electrons, back-scattered electrons, X-rays (characteristic X-rays) and the like are emitted from each measurement point of the specimen S. An electron image can be acquired by detecting the electrons emitted from each measurement point using the electron detector 30, and generating an image of the distribution of the intensity of the electrons. Further, an X-ray map can be acquired by detecting the X-ray emitted from each measurement point using the WDS 50a, WDS 50b, WDS 50c, WDS 50d and WDS 50e, and generating an image of the distribution of the X-ray.

Figure 3:
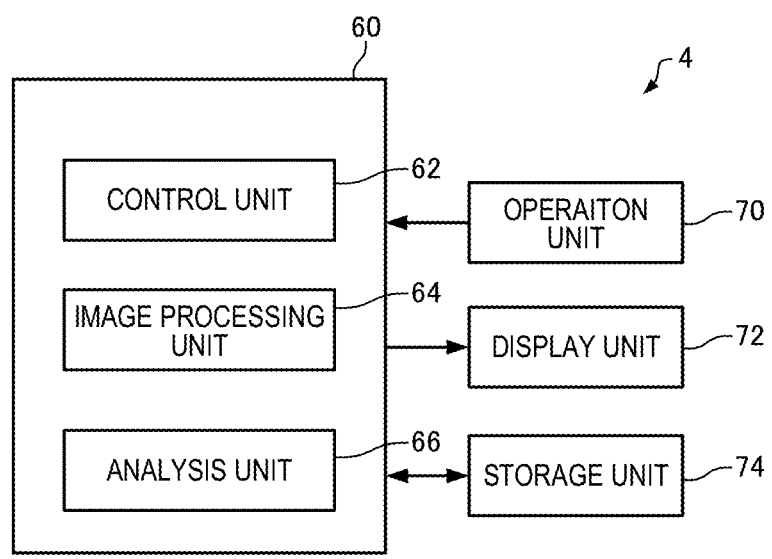
FIG. 3 is a diagram illustrating a configuration of an image processor.

FIG. 3 is a block diagram illustrating a configuration of the image processor 4.

The image processor 4 processes an image based on the result of the measurement of the specimen S performed by the analyzer main body 2. As indicated in FIG. 3, the image processor 4 includes a processing unit 60, an operation unit 70, a display unit 72 and a storage unit 74.

The operation unit 70 acquires operation signals in accordance with the operation performed by the user, and sends the operation signals to the processing unit 60. The operation unit 70 consists of: buttons, keys, a touch panel type display, a microphone, or the like.

The display unit 72 displays an image generated by the processing unit 60. The display unit 72 is implemented by such a display as a liquid crystal display (LCD), for example.

The storage unit 74 stores programs and data for the processing unit 60 to perform various computing processing and image processing. The storage unit 74 is also used as a work area of the processing unit 60. The storage unit 74 is implemented by a random access memory (RAM), a read only memory (ROM), a hard disk and the like, for example.

The processing unit 60 performs processing of correcting the positional deviation of an image, processing of generating a phase map from a plurality of X-ray maps, and the like. The functions of the processing unit 60 are implemented by various processors (e.g. central processing unit (CPU)) executing programs stored in the storage unit 74. The processing unit 60 includes a control unit 62, an image processing unit 64 and an analysis unit 66.

The control unit 62 controls the analyzer main body 2. For example, the control unit 62 causes the analyzer main body 2 to perform the measurement to acquire an electron image and the measurement to acquire the X-ray map.

The image processing unit 64 acquires the electron image and the X-ray map based on the result of the measurement by the analyzer main body 2, and performs image processing on the electron image and the X-ray image. For example, the image processing unit 64 performs processing of correcting the positional deviations of a plurality of X-ray maps acquired by a plurality of times of measurement.

The analysis unit 66 analyzes the correlations among the elements based on the plurality of X-ray maps of which positional deviation was corrected by the image processing unit 64, and creates the phase map.

2. Image Processing Method
2.1. Correction of Positional Deviation of X-Ray Map
2.1.1. Positional Deviation of X-Ray Map The analyzer 100 can create a phase map. In order to create a phase map, a plurality of X-ray maps must be acquired in a same measurement target region. The analyzer 100 is equipped with the five WDSs, hence five X-ray maps can be acquired simultaneously. If six or more X-ray maps are acquired in a same measurement region of the specimen S, the same region must be measured a plurality of times. In this case, a positional deviation may be generated among the X-ray maps for such a reason as specimen drift.

The analyzer 100 can correct the positional deviation among the X-ray maps acquired by performing the measurement for a plurality of times in the same measurement target region. Image processing to correct the positional deviation of the X-ray maps will be described next.

2.1.2. Flow of Image Processing

Figure 4:
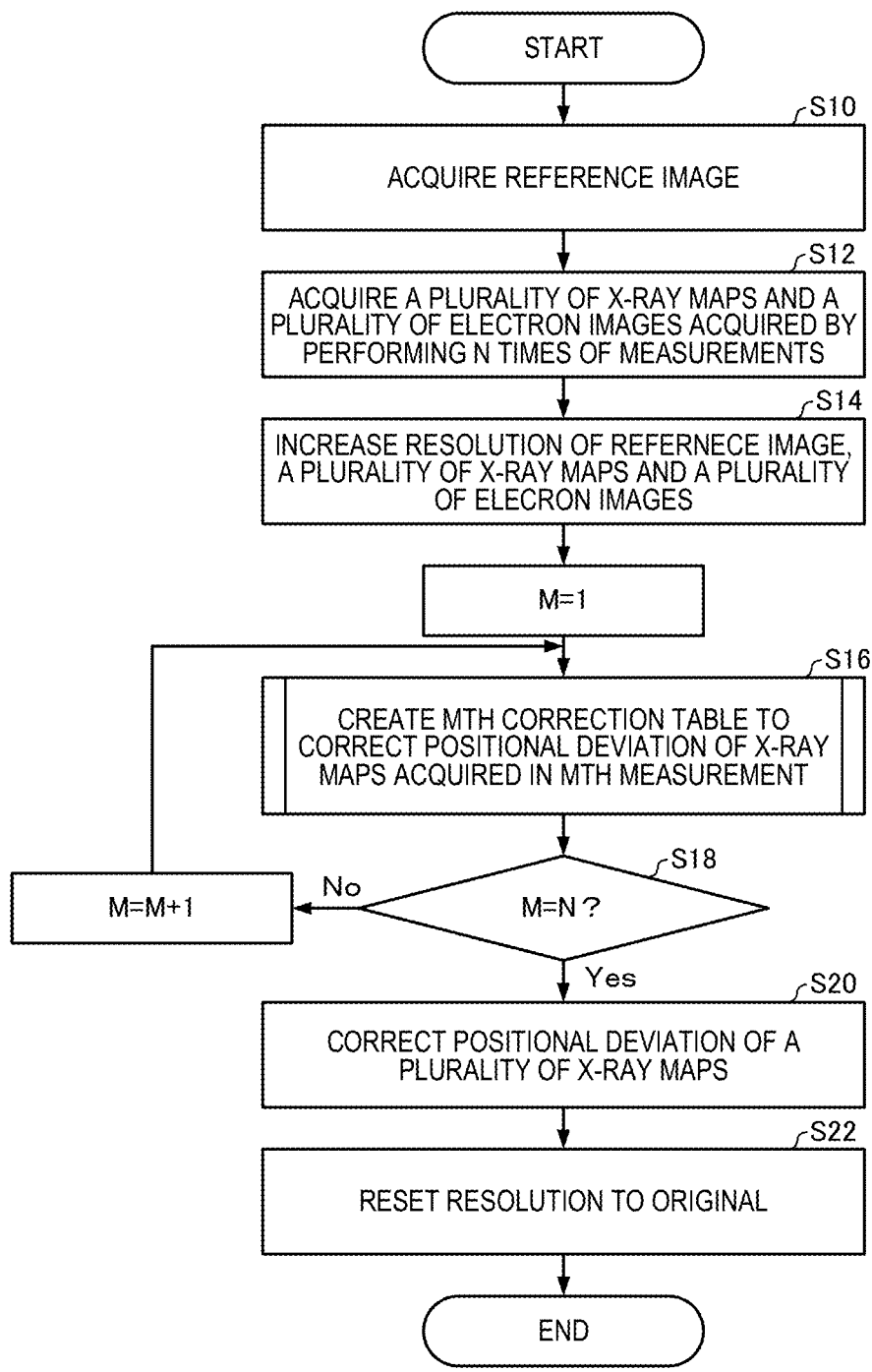
FIG. 4 is a flow chart illustrating an example of image processing.

FIG. 4 is a flow chart illustrating an example of the image processing.

First the image processing unit 64 acquires a reference image, which is an electron image to be a reference to correct the positional deviation (S10).

For example, the control unit 62 causes the analyzer main body 2 to measure the measurement target region of the specimen S, and the image processing unit 64 acquires a measurement image, which is an electron image based on this measurement result.

Then the control unit 62 causes the analyzer main body 2 to measure the measurement target region of the specimen S for a plurality of times, and the image processing unit 64 acquires a plurality of X-ray maps and a plurality of electron images (measurement images) (S12).

The analyzer main body 2 includes five WDSs, which means that five X-ray maps can be acquired in one measurement step. Further, the analyzer main body 2 includes the electron detector 30, hence an electron image can be acquired simultaneously with the X-ray maps. In this description, it is assumed that the specimen S is measured for N times (N>2), and five X-ray maps and one electron image are acquired in one measurement step. In other words, the image processing unit 64 acquires 5×N number of X-ray maps and N number of electron images.

For example, the control unit 62 causes the analyzer main body 2 to measure the measurement target region of the specimen S for N times, and the image processing unit 64 acquires 5×N number of X-ray maps and N number of electron images based on these measurement results.

Then the image processing unit 64 increases the resolution of the acquired reference image, the 5×N number of X-ray maps and the N number of electron images (S14).

The resolution is increased by interpolating the pixels of the image, for example. The method of increasing the resolution is not especially limited.

Then the image processing unit 64 creates a first correction table T1 for correcting the positional deviations of the five X-ray maps acquired in the first (M=1) measurement (S16).

The first correction table T1 is a table in which, for each pixel of the X-ray map, a positional deviation amount of the pixel in the X direction and a positional deviation amount of the pixel in the Y direction are registered. The first correction table T1 is a table created by calculating the positional deviation amount between the reference image and the electron image acquired in the first measurement. The processing to create the first correction table T1 will be described later.

Then the image processing unit 64 determines whether M=N is established (S18). In other words, the image processing unit 64 determines whether the Nth correction table TN for correcting the positional deviations of the five X-ray maps acquired in the Nth measurement is created.

If it is determined that M=N is not established (No in S18), processing returns to the processing S16, and the image processing unit 64 creates a second correction table T2 for correcting the positional deviations of the five X-ray maps acquired in the second (M=2) measurement (S16).

The image processing unit 64 repeats the processing S16 until M=N is determined in the processing S18, that is, until the Nth correction table TN is created.

If it is determined that M=N is established (Yes in S18), the image processing unit 64 corrects the positional deviations of the 5×N number of X-ray maps using from the first to Nth correction tables T1 to TN (S20).

For example, using the first correction table T1, the image processing unit 64 corrects the positional deviations of the five X-ray maps acquired in the first measurement. In the same manner, using the second correction table T2, the image processing unit 64 corrects the positional deviations of the five X-ray maps acquired in the second measurement. In the same manner, using the Nth correction table TN, the image processing unit 64 corrects the positional deviations of the five X-ray maps acquired in the Nth measurement.

For each of the corrected 5×N number of X-ray maps, the image processing unit 64 may perform processing to crop both ends of an image by a number of pixels corresponding to the maximum deviation amount. This allows the 5×N number of X-ray maps to be in the same field-of-view.

The image processing unit 64 returns the resolution of the 5×N number of X-ray maps, which was enhanced in the processing S14, to the original resolution (S22). The method of returning the resolution of the X-ray maps to the original resolution is not especially limited. Then the image processing unit 64 ends the image processing.

By the above processing, the positional deviations of the 5×N number of X-ray maps can be corrected.

2.1.3. Processing of Creating Correction Table

Figure 5:
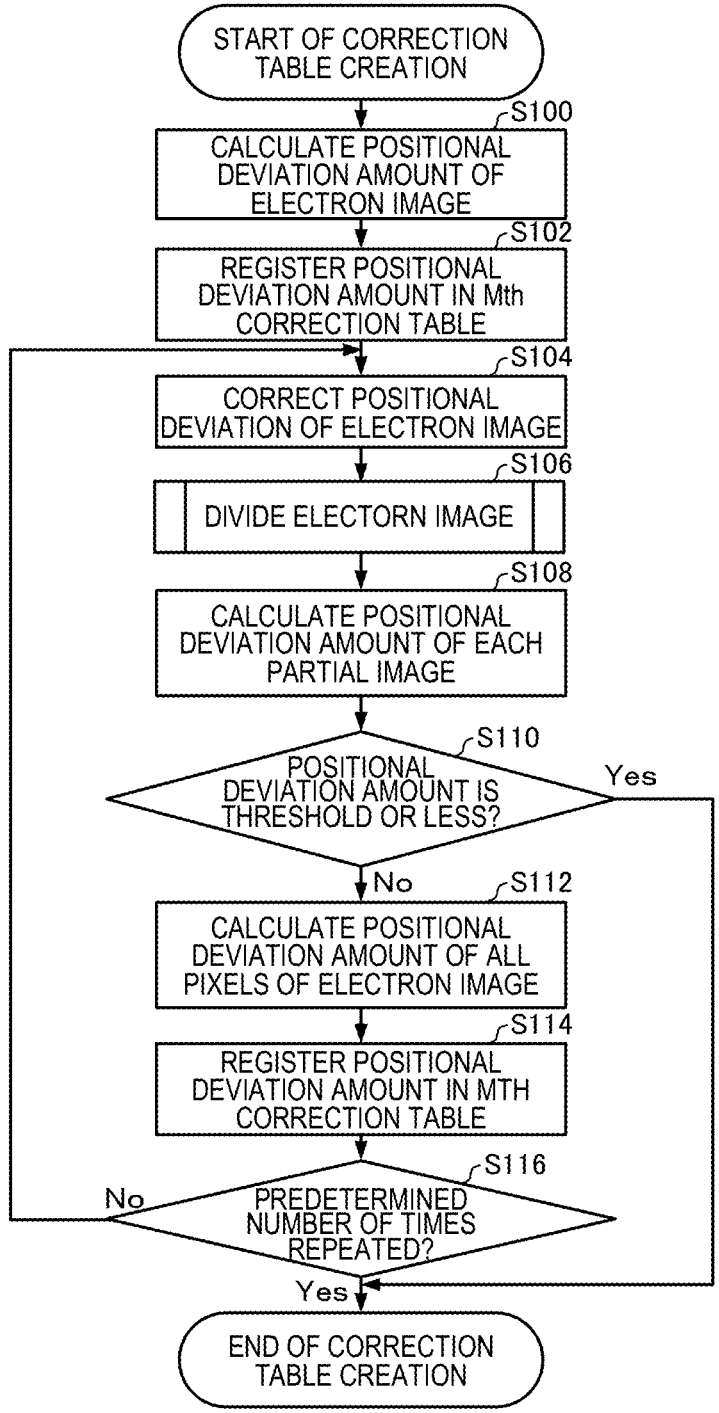
FIG. 5 is a flow chart illustrating an example of processing of creating a correction table.

FIG. 5 is a flow chart illustrating an example of the processing S16 of creating the correction table.

The image processing unit 64 calculates the positional deviation amount of an electron image acquired in the first (M=1) measurement (hereafter referred to as "first electron image") (S100).

The image processing unit 64 calculates a positional deviation amount of the first electron image from the reference image. The positional deviation amount is calculated by performing pattern matching between all the regions of the reference image and all the regions of the first electron image, for example. The positional deviation amount is expressed by the positional deviation amount of the electron image in the X direction, and the positional deviation amount of the electron image in the Y direction.

The image processing unit 64 registers the positional deviation amount, which was calculated in the processing step S100, in the first correction table T1 (S102). The first correction table T1 is stored in the storage unit 74, for example.

Figure 6:
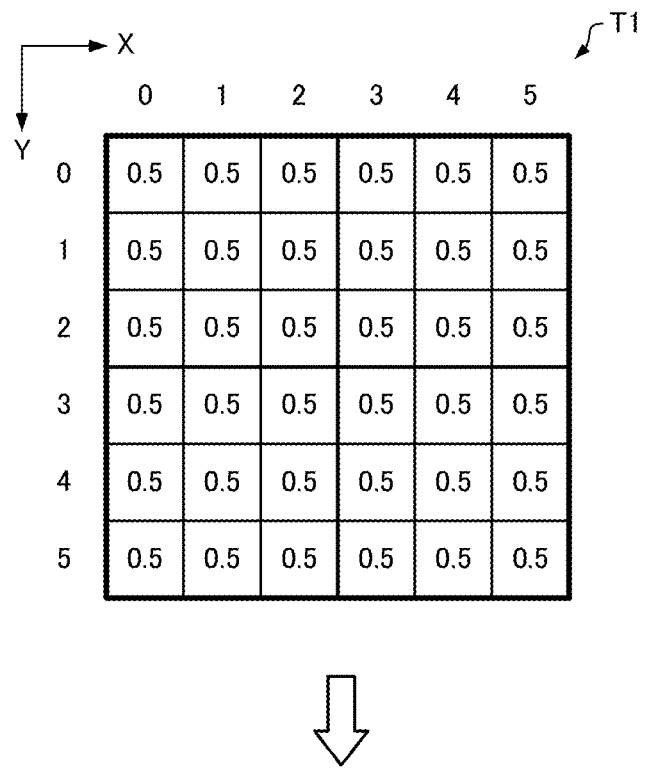
FIG. 6 is a diagram for describing a first correction table.
Figure 6:
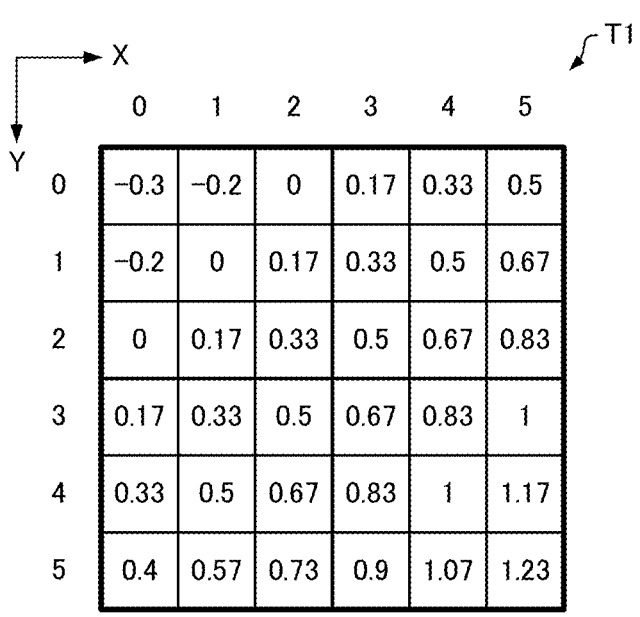

FIG. 6 is a diagram for describing the first correction table T1.

As indicated in FIG. 6, in the first correction table T1, coordinates (X, Y) of each pixel of the first electron image and the positional deviation amount of each pixel are linked and registered. The first correction table T1 includes a table to indicate the positional deviation amount of each pixel in the X direction, and a table to indicate the positional deviation amount of each pixel in the Y direction. The tables in FIG. 6 indicate the positional deviation amounts of each pixel in the X direction.

The positional deviation amounts are calculated by pattern matching all the regions of the reference image and all the regions of the first electron image, hence a same value is registered for all the pixels in the first correction table T1. A positional deviation in one direction can be corrected using this first correction table T1.

Then the image processing unit 64 corrects the positional deviation of the first electron image using the first correction table T1 (S104).

Then the image processing unit 64 divides the first electron image and the reference image into a plurality of partial images respectively (S106).

Figure 7:
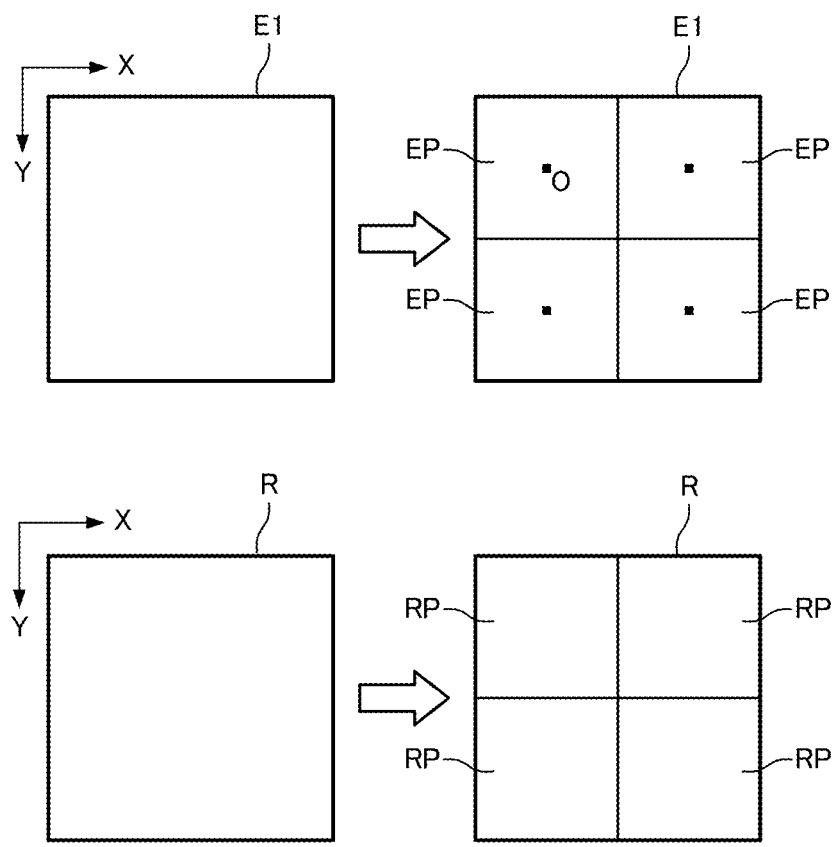
FIG. 7 is a diagram for describing processing of dividing a first electron image.

FIG. 7 is a diagram for describing the processing of dividing the first electron image E1. As indicated in FIG. 7, the first electron image E1 is divided into four partial image EPs (an example of partial measurement images). A partial image EP is an image acquired by equally dividing the field-of-view of the first electron image E1, for example. In the case of the example in FIG. 7, the first electron image E1 is divided into two in the X direction and into two in the Y direction, whereby four partial image EPs are created. Just like the first electron image E1, the reference image R is also divided into four partial image RPs (an example of partial reference images). A partial image RP is an image acquired by equally dividing the field-of-view of the reference image R.

The dividing processing in S106 will be described in detail later in "2.1.4. Processing of dividing electron image".

In each of the four partial image EPs, the image processing unit 64 calculates the positional deviation amount relative to the corresponding partial image RP (S108).

For example, the image processing unit 64 performs pattern matching between one partial image EP and a partial image RP corresponding to this one partial image EP, then calculates the positional deviation amount of a center pixel O of this one partial image EP from the center of the partial image RP. The image processing unit 64 performs this calculation of the positional deviation amount of the center pixel O for the four partial image EPs respectively. The center pixel O is a pixel matching with or closest to the center of the partial image.

The image processing unit 64 determines whether the positional deviation amounts of the center pixels O of the four partial image EPs are a threshold or less (S110).

The image processing unit 64 determines whether the positional deviation amounts are not the threshold or less if at least one of the positional deviation amounts of the center pixels O of the four partial image EPs exceeds the threshold. The threshold is set to an arbitrary value. As the threshold becomes smaller, the positional deviation can be corrected more accurately.

If it is determined that the positional deviation amounts are not the threshold or less (No in S110), the image processing unit 64 calculates the positional deviation amounts of all the pixels of the first electron image E1 (S112).

Figure 8:
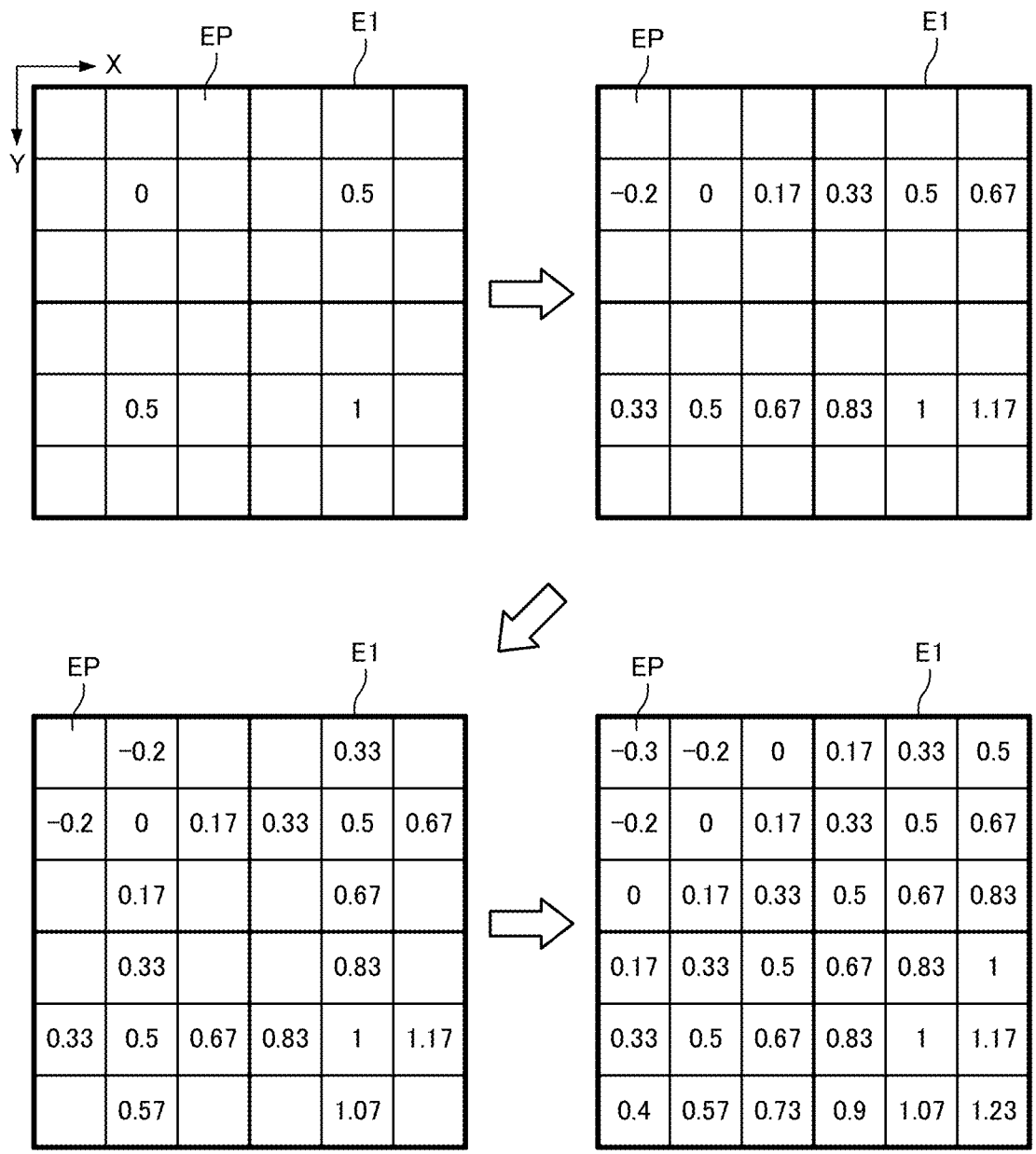
FIG. 8 is a diagram for describing processing of calculating positional deviation amounts of all pixels of a first electron image.

FIG. 8 is a diagram for describing the processing of calculating the positional deviation amounts of all the pixels of the first electron image E1.

The positional deviation amounts of all the pixels of the first electron image E1 are calculated based on the positional deviation amounts of the center pixels O of the adjacent partial image EPs. For example, as indicated in FIG. 8, the positional deviation amounts of the other pixels are interpolated from the positional deviation amounts of the center pixels O of the partial image EPs. In the case of the example in FIG. 8, the positional deviations of the pixels disposed in the X direction are linearly interpolated first, using the positional deviation amounts of the center pixels O disposed in the X direction. Then the positional deviation amounts of the pixels disposed in the Y direction are linearly interpolated using the positional deviation amounts of the center pixels O disposed in the Y direction. Finally, the positional deviation amounts of the remaining pixels are interpolated using the positional deviation amounts of the adjacent pixels. Thereby the positional deviation amounts of all the pixels of the first electron image E1 can be calculated. The method of calculating the positional deviation amounts of each pixel is not especially limited.

The image processing unit 64 registers the calculated positional deviation amounts of all the pixels of the first electron image E1 in the first correction table T1, and updates the first correction table T1 (S114).

As indicated in FIG. 6, in the processing step S100, the positional deviation amounts are calculated by pattern matching between all the regions of the reference image R and all the regions of the first electron image E1, hence in the processing S102, the same values are registered in the first correction table T1 as the positional deviation amounts of all the pixels. In the first correction table T1, the positional deviation in one direction can be corrected.

In the processing S112, the positional deviation amounts of all the pixels are calculated based on the positional deviation amount determined for each partial image EP. Therefore in the first correction table T1 updated in the processing S114, not only the positional deviation in one direction, but also the enlargement/reduction, distortion and the like can be corrected.

The image processing unit 64 determines whether the processing S104, the processing S106, the processing S108, the processing S110, the processing S112 and the processing S114 were repeated for a predetermined number of times (S116). The predetermined number of times can be set to an arbitrary number.

If it is determined that the above processing steps were not repeated for a predetermined number of times (No in S116), the image processing unit 64 returns to the processing S104, and corrects the positional deviation of the first electron image E1 using the first correction table T1. Then the image processing unit 64 performs the processing of dividing the electron image (S106), the processing of calculating the positional deviation amount of each partial image (S108), the processing of determining whether the positional deviation amount is the threshold or less (S110), the processing of calculating the positional deviation amounts of all the pixels (S112), and the processing of registering the positional deviation amounts (S114).

The image processing unit 64 repeats the processing S104, the processing S106, the processing S108, the processing S110, the processing S112 and the processing S114 until it is determined that the above processing steps were repeated for a predetermined number of times in the processing S116 (Yes in S116), or it is determined that the positional deviation amount is the threshold or less (Yes in S110).

The image processing unit 64 ends the processing of creating the first correction table T1 if it is determined that the above processing steps were repeated for a predetermined number of times in the processing S116 (Yes in S116), or it is determined that the positional deviation amount is the threshold or less in the processing S110 (Yes in S110).

The above describes the processing of creating the first correction table T1, but the same description is also applicable to each processing of creating from the second to the Nth correction tables T2 to TN.

2.1.4. Processing of Dividing Electron Image

Figure 9:
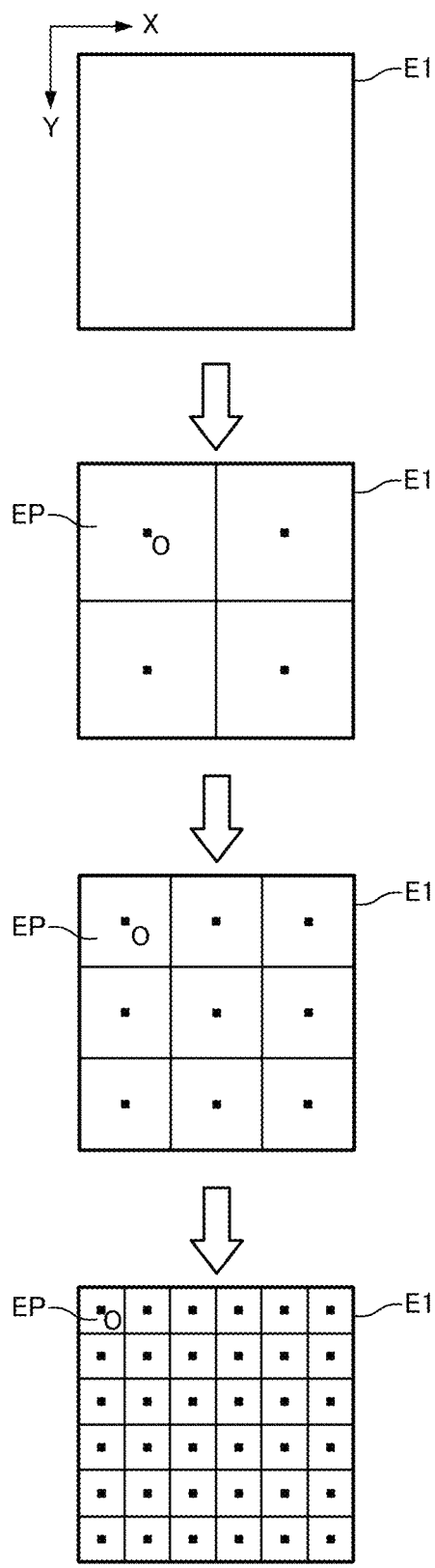
FIG. 9 is a diagram for describing processing of dividing an electron image.

FIG. 9 is a diagram for describing the processing S106 of dividing the electron image.

As indicated in FIG. 9, a number of the partial image EPs can be increased by repeating the processing of dividing the first electron image E1 so as to decrease the size of the partial image EP, that is, to decrease the area (number of pixels) of the partial image EP, and thereby the positional deviation of the first electron image E1 can be corrected more accurately. However, as the size of the partial image EP decreases, the accuracy of pattern matching also decreases.

Hence in the case where the size of the partial image EP becomes a predetermined reference size or less, the image processing unit 64 increases a number of partial image EPs by increasing the overlapping amounts of the adjacent partial image EPs, without changing the size of the partial image EP.

Figure 10:
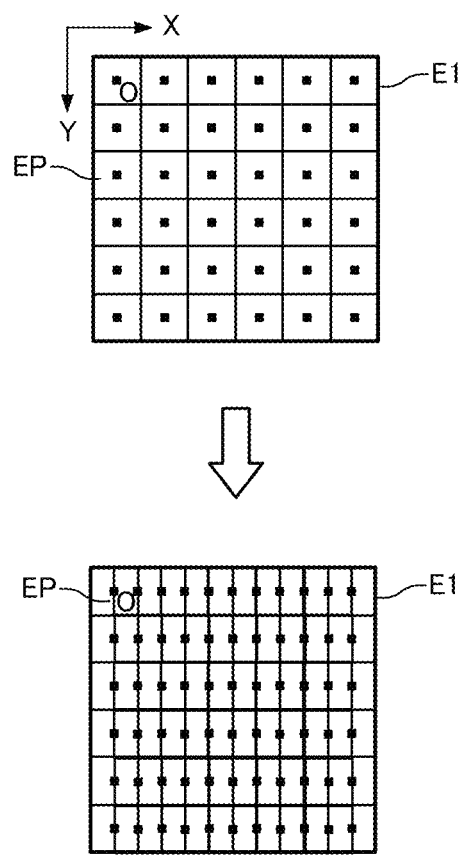
FIG. 10 is a diagram for describing processing of making an overlapping amount of adjacent partial images to be larger.

FIG. 10 is a diagram for describing the processing of increasing the overlapping amount of the adjacent partial image EPs.

As indicated in FIG. 10, a number of partial image EPs can be increased without changing the size of the partial image EP, by increasing the overlapping amount of the adjacent partial image EPs. In FIG. 10, the overlapping amount of the partial image EPs which are adjacent in the X direction is increased. However, the overlapping amount of the partial image EPs which are adjacent in the Y direction may be increased, or both the overlapping amount of the partial image EPs which are adjacent in the X direction and the overlapping amount of the partial image EPs which are adjacent in the Y direction may be increased.

Figure 11:
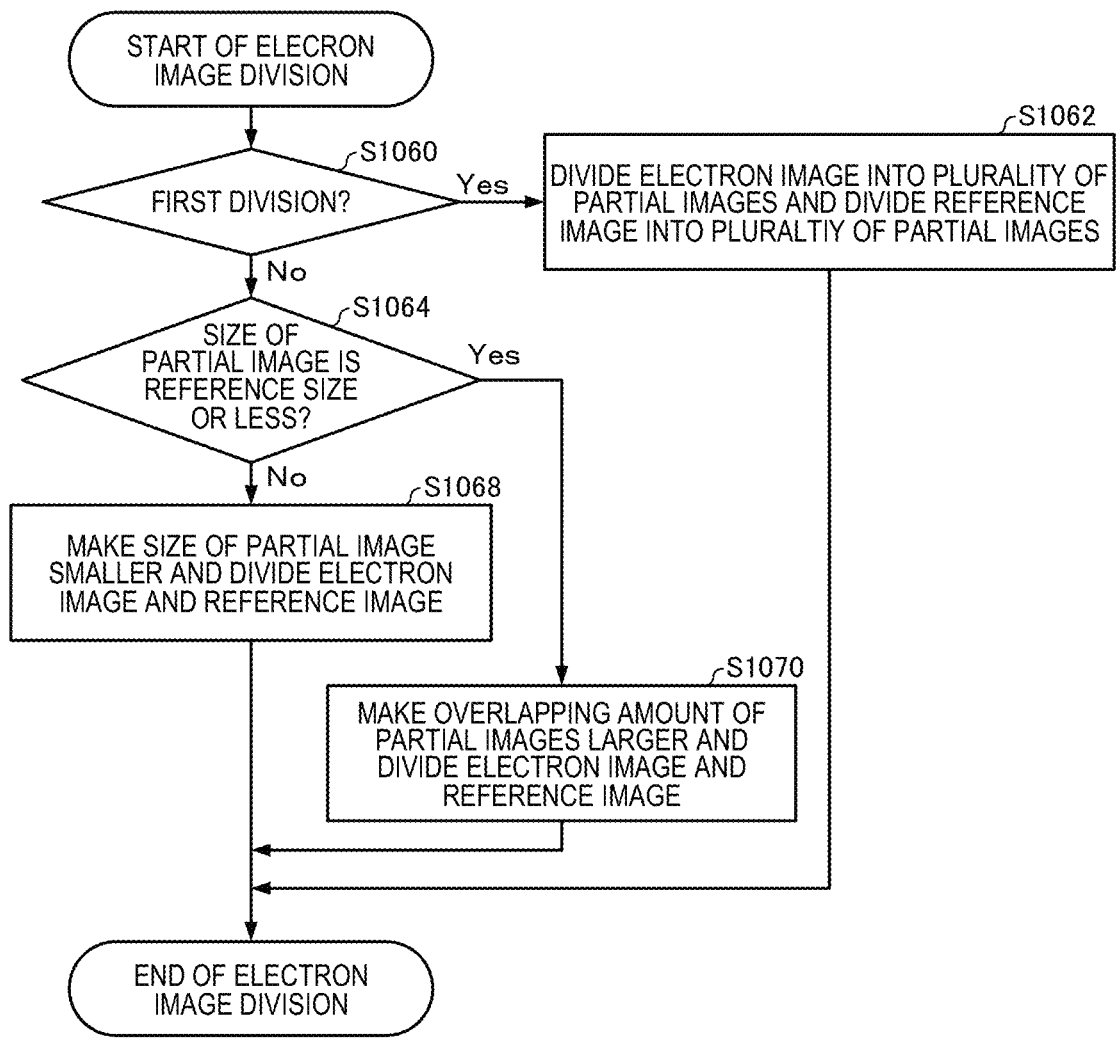
FIG. 11 is a flow chart illustrating an example of processing of dividing an electron image.

FIG. 11 is a flow chart illustrating an example of the processing of dividing the electron image.

The image processing unit 64 determines whether the processing of dividing the first electron image E1 is the first time (S1060), and if it is determined that the processing is the first time (Yes in S1060), the image processing unit 64 divides the first electron image E1 into a plurality of partial image EPs, as indicated in FIG. 7 (S1062). The image processing unit 64 also divides the reference image R into a plurality of partial image RP in the same manner as the first electron image E1.

If it is determined that the processing of dividing the first electron image E1 is not the first time (No in S1060), the image processing unit 64 determines whether the size of the partial image (partial image EP and partial image RP) is a reference size or less (S1064). The reference size is set to a minimum size with which pattern matching can be performed accurately, for example. The reference size, however, can be set arbitrarily, in accordance with the required accuracy of pattern matching, the repeat cycle of the patterns, and the like.

If it is determined that the size of the partial image is not the reference size or less (No in S1064), the image processing unit 64 decreases the size of the partial image, with which the first electron image E1 and the reference image R are divided, as indicated in FIG. 9 (S1068). For example, the image processing unit 64 decreases the size of the partial image in the Mth processing S1068 to be smaller than the size of the partial image in the M−1th processing S1068. Thereby a number of partial images generated in the Mth processing S1068 becomes more than the number of partial images generated in the M−1th processing S1068.

If it is determined that the size of the partial image is the reference size or less (Yes in S1064), the image processing unit 64 makes the overlapping amount of the adjacent partial image EPs to be larger without changing the size of the partial image EPs, as indicated in FIG. 10, and thereby divides the first electron image E1 and the reference image R (S1070). For example, the image processing unit 64 makes the overlapping amount of the adjacent partial images in the Mth processing S1070 to be larger than the overlapping amount of the adjacent partial images in the M−1th processing S1070. Thereby a number of partial images generated in the Mth processing S1070 becomes more than the number of partial images generated in the M−1th processing S1070.

After the processing S1062, the processing S1068 or the processing S1070 is performed to divide the first electron image E1 and the reference image R, the image processing unit 64 ends the processing S106 of dividing the electron image.

The above describes the processing of dividing the first electron image E1, but the same description is also applicable to each processing of dividing the second to the Nth electron images.

2.2. Phase Analysis

In the analyzer 100, the analysis unit 66 creates a phase map using 5×N number of X-ray maps of which positional deviations have been corrected in the above image processing.

Figure 12:
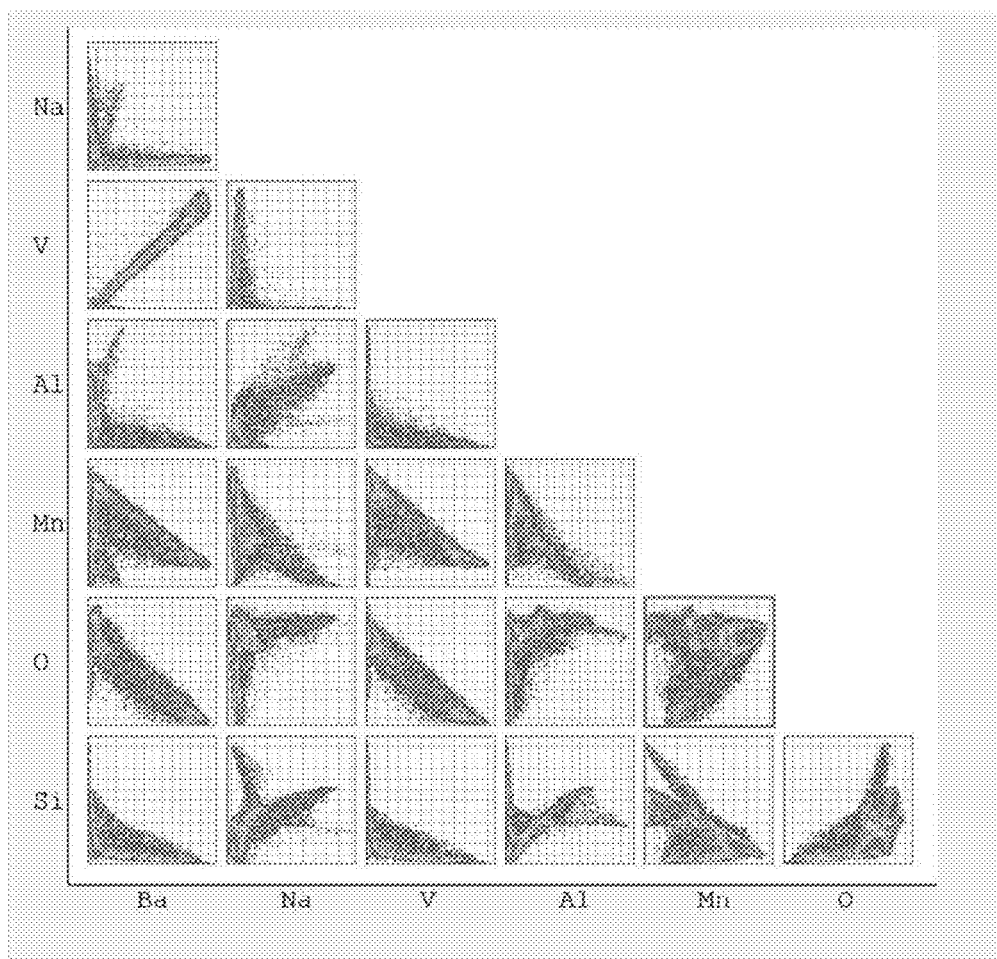
FIG. 12 is a diagram indicating scatter plots.

The analysis unit 66 creates scatter plots based on the 5×N number of X-ray maps. For example, two maps are selected from the 5×N number of X-ray maps, and plots the X-ray intensity of each pixel in the scatter plots, of which the ordinate is the X-ray intensity of one of the selected two maps, and the abscissa is the X-ray intensity of the other thereof. FIG. 12 indicates the scatter plots.

Figure 13:
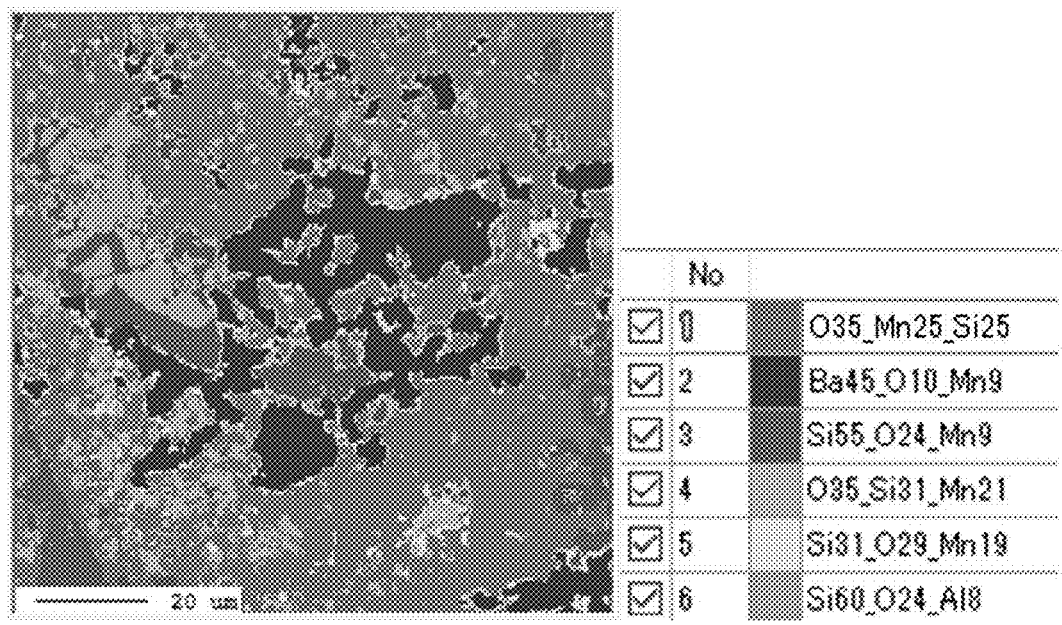
FIG. 13 is a phase map.

Then the analysis unit 66 searches the unevenly distributed areas in the scatter plots, encloses the unevenly distributed areas, and color code those areas. By showing colors on the display of the X-ray map, the analysis unit 66 creates a phase map. FIG. 13 indicates the phase map.

3. Functional Effects

In the analyzer 100, the image processing unit 64 divides the measurement image, which is an electron image of which positional deviation is corrected, and the reference image, which is an electron image to be a reference of the positional deviation correction, into partial images respectively, and in each of the plurality of partial images generated by dividing the measurement image, a positional deviation amount from a corresponding partial image of the reference image is calculated, and the positional deviation of the measurement image is corrected based on this positional deviation amount. Therefore in the analyzer 100, not only the positional deviation in one direction, but the enlargement/reduction, distortion and the like can also be corrected. As described above, in the analyzer 100, the positional deviation between the measurement image and the reference image, acquired at different timings, can be accurately measured.

In the analyzer 100, the size of the partial image in the dividing processing S1068 for the Mth time is made smaller than the size of the partial image in the dividing processing S1068 for the M−1th time. Since the analyzer 100 gradually decreases the size of the partial image like this, a drop in the accuracy of the pattern matching, when the positional deviation amount is calculated, can be minimized. For example, in a case where there are many similar patterns in a measurement image, if the size of the partial image changes considerably, then pattern recognition errors tend to occur, and the accuracy of the pattern matching drops.

In the analyzer 100, in a case where it is determined that the size of the partial image EP is the reference size or less, an overlapping amount of the adjacent partial images is increased when the measurement image and the reference image are divided. In other words, in the dividing processing S1070 for the Mth time, the overlapping amount of the adjacent partial images is increased compared with the dividing processing S1070 for the M−1th time. Thereby a drop in the accuracy of the pattern matching caused by a decrease in the size of the partial image can be minimized.

In the analyzer 100, the image processing unit 64 creates a correction table for correcting the positional deviation of the measurement image, based on the positional deviation amount of a plurality of partial images acquired by dividing the measurement image. Therefore using the correction table, the analyzer 100 can correct the positional deviation of the X-ray map, which is acquired simultaneously with the measurement image.

Here the back-scattered electrons and the secondary electrons have high signal amounts compared with the characteristic X-rays. Therefore the positional deviation of the X-ray map can be corrected more accurately by calculating the positional deviation amount using the electron image to create the correction table, and correcting the X-ray map using this correction table. In particular, even in the case of the X-ray map of a trace element of which S/N ratio is insufficient, the positional deviation of the X-ray map can be accurately corrected.

For example, in order to analyze the correlation of the element A and the element B, in a case where the positional deviation of the X-ray map cannot be corrected, an X-ray map, indicating a distribution of an element A and an X-ray map indicating a distribution of an element B must be measured simultaneously. Furthermore, in order to analyze the correlations among multiple elements, the measurement must be repeated with changing the combination of the measurement target element.

Figure 14:
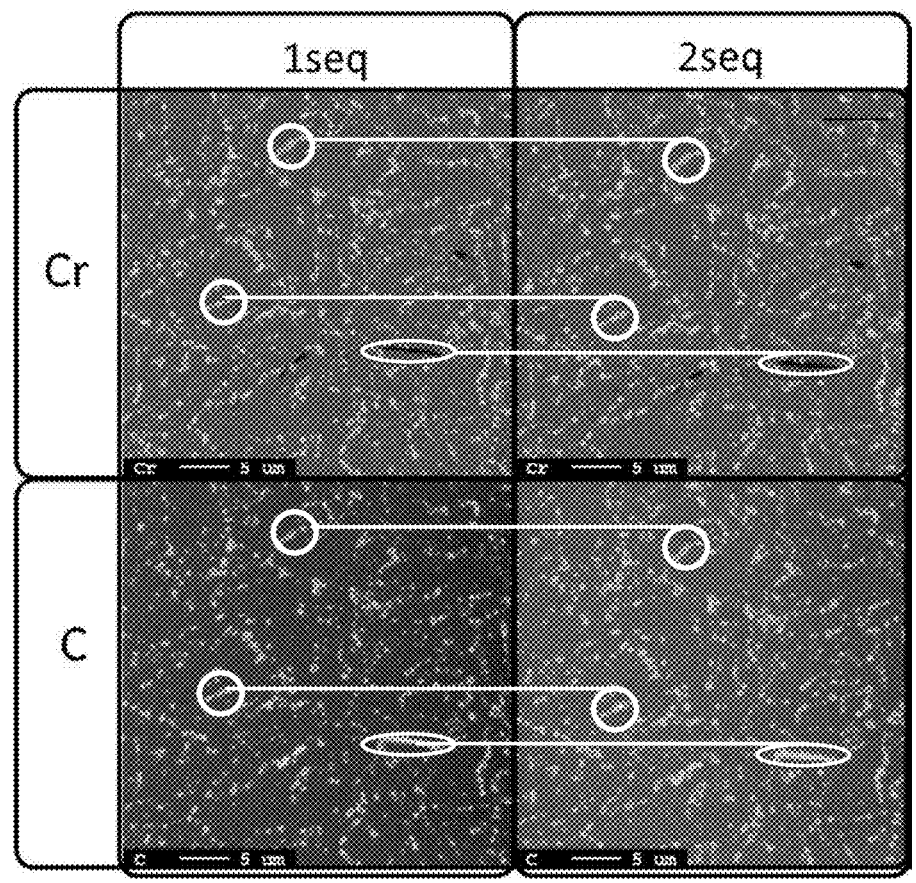
FIG. 14 is a diagram illustrating a positional deviation between an X-ray map based on the first measurement and an X-ray map based on the second measurement.

FIG. 14 is a diagram illustrating a positional deviation between an X-ray map based on the first measurement (1 seq) and an X-ray map based on the second measurement (2 seq). In FIG. 14, the distribution of the intensity of the X-ray of Cr and the distribution of the intensity of the X-ray of C are indicated.

As indicated in FIG. 14, the X-ray map acquired in the second measurement has a positional deviation from the X-ray map acquired in the first measurement.

Figure 15:
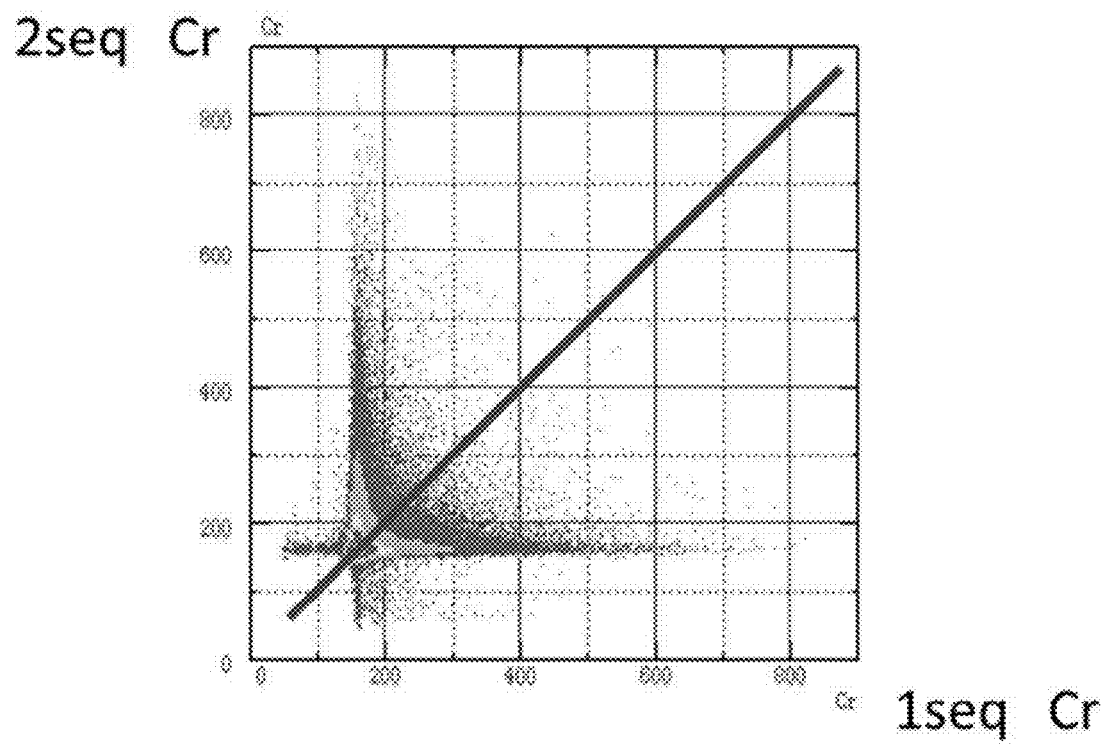
FIG. 15 is a scatter plot of the intensity of each pixel of the X-ray map based on the first measurement, and the intensity of each pixel of the X-ray map based on the second measurement.

FIG. 15 is a scatter plot of the intensity of each pixel of the X-ray map of Cr based on the first measurement and the intensity of each pixel of the X-ray map of Cr based on the second measurement. In FIG. 15, the abscissa indicates the intensity of the X-ray of the Cr in the first measurement, and the ordinate indicates the intensity of the X-ray of the Cr in the second measurement.

In a case where the X-ray map acquired in the second measurement has no positional deviation from the X-ray map acquired in the first measurement, the data is distributed on the line indicated in FIG. 15. In a case where the X-ray map acquired in the second measurement has positional deviation from the X-ray map acquired in the first measurement as indicated in FIG. 14, the data is not distributed on the line indicated in FIG. 15.

Figure 16:
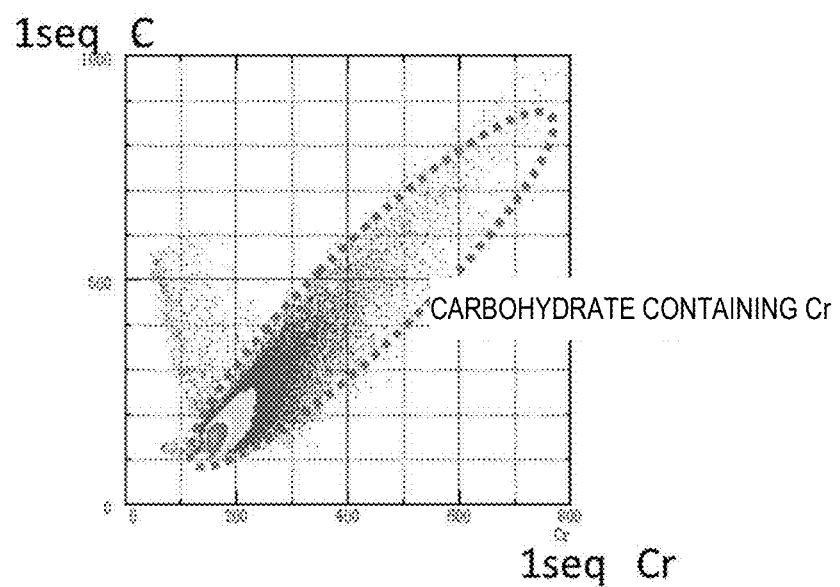
FIG. 16 is a scatter plot of the intensity of each pixel of the X-ray map of C and the intensity of each pixel of the X-ray map of Cr, which were measured simultaneously.
Figures 17, 18:
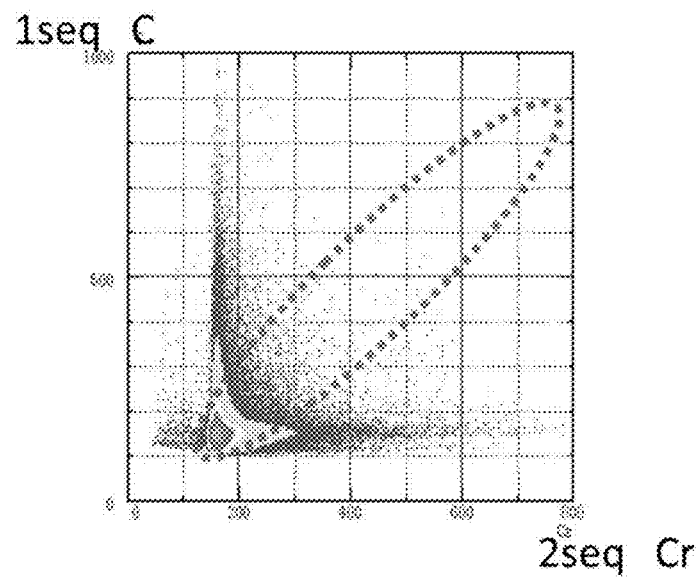
FIG. 17 is a scatter plot of the intensity of each pixel of the X-ray map of C and the intensity of each pixel of the X-ray map of Cr, in a case where positional deviation exists.
FIG. 18 is a table indicating an example of combinations of measurement elements.

FIG. 16 is a scatter plot of the intensity of each pixel of the X-ray map of C and the intensity of each pixel of the X-ray map of Cr, which were measured simultaneously. FIG. 17 is a scatter plot of the intensity of each pixel of the X-ray map of C and the intensity of each pixel of the X-ray map of Cr, in a case where positional deviation exists.

As indicated in FIG. 16, in the case where there is no positional deviation, the correlations of Cr and C are correctly indicated on the scatter plot. In the case where a positional deviation exists, on the other hand, the correlation of Cr and C is not correctly indicated in the scatter plot. Therefore the elements, to be the targets of the correlation analysis, must be measured simultaneously.

FIG. 18 is a table indicating an example of the combinations of the measurement elements in a case where the correlations of an element A, element B, element C, element D, element E and element F are analyzed.

As indicated in FIG. 18, in order to analyze the correlations among multiple elements, the measurement must be repeated many time while changing the measurement elements gradually, so that all combinations of the target elements of the correlation analysis can be measured simultaneously.

However, in the case of the analyzer 100, the positional deviations of the X-ray maps acquired at different timings can be corrected, hence there is no need to measure the same element many times. Therefor in the analyzer 100, the measurement time can be decreased even in the case of analyzing the correlations among multiple elements.

Figure 19:
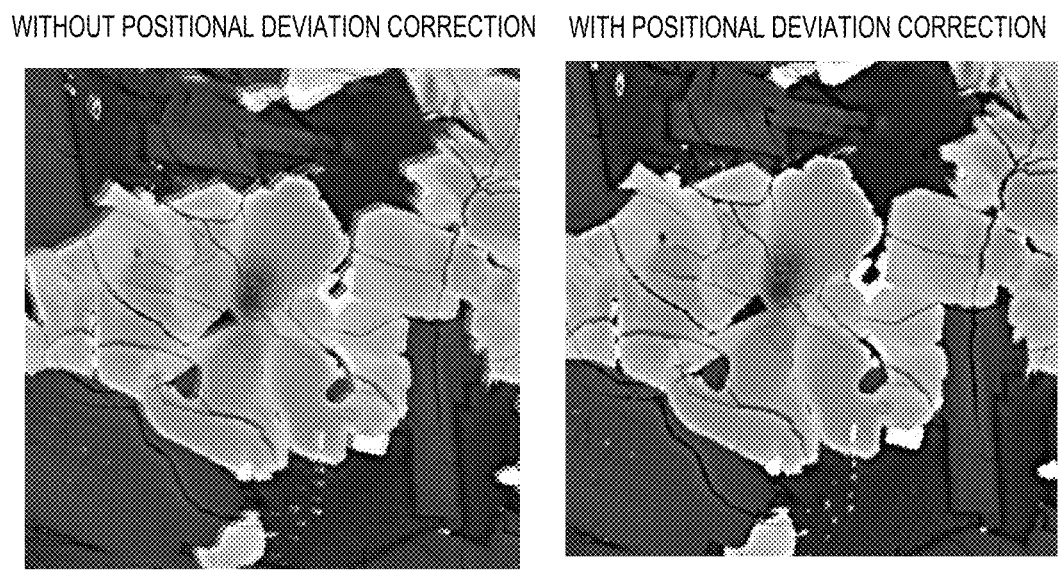
FIG. 19 indicates images generated by superimposing two back-scattered electron images acquired at different timings.

FIG. 19 indicates images generated by superimposing two back-scattered electron images acquired at different timings. As indicated in FIG. 19, the two back-scattered electron images are accurately superimposed by correcting the positional deviation between the two back-scattered electron images.

In the analyzer 100, the positional deviation of the X-ray maps acquired at different timings can be corrected, hence even in a case of creating a phase map which indicates the distribution of compounds, an accurate phase map can be created in a short time.

Figure 20:
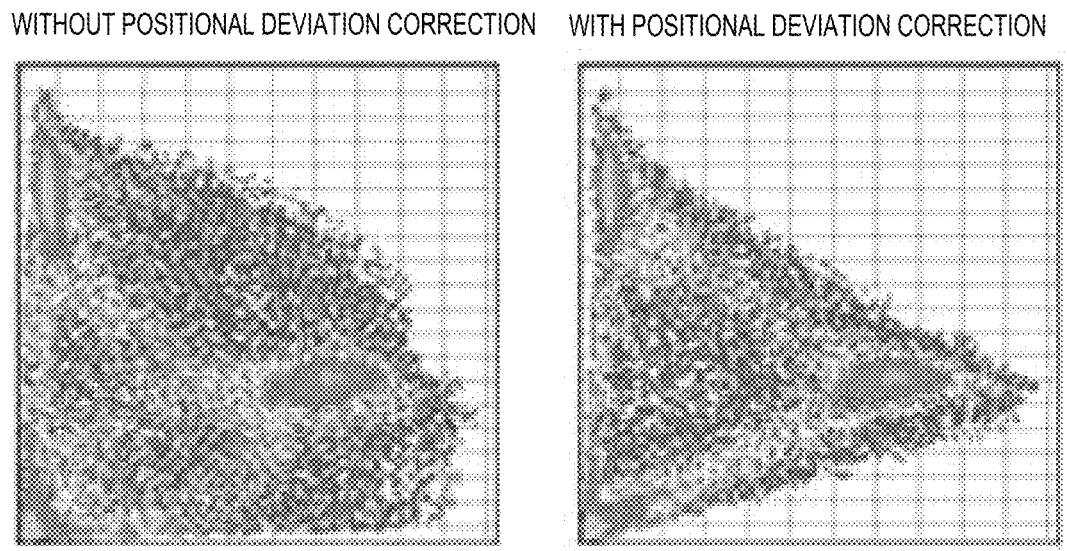
FIG. 20 indicates scatter plots of the intensity of each pixel of two X-ray maps acquired at different timings.

FIG. 20 indicates the scatter plots of the intensity of each pixel of two X-ray maps acquired at different timings. As indicated in FIG. 20, the correlation of the two elements can be accurately indicated by correcting the potential deviations of the two X-ray maps.

4. Modifications

The invention is not limited to the above-described embodiments, and various modifications can be made within the scope of the invention.

4.1. Modification 1

In the above embodiment, the target X-ray map of the positional deviation correction and the electron image are acquired after the reference image is acquired, as indicated in FIG. 4, but an electron image acquired at the same time with the target X-ray map of the positional deviation correction may be used as the reference image. For example, the electron image acquired in the first measurement may be used as the reference image.

4.2. Modification 2

Figure 21:
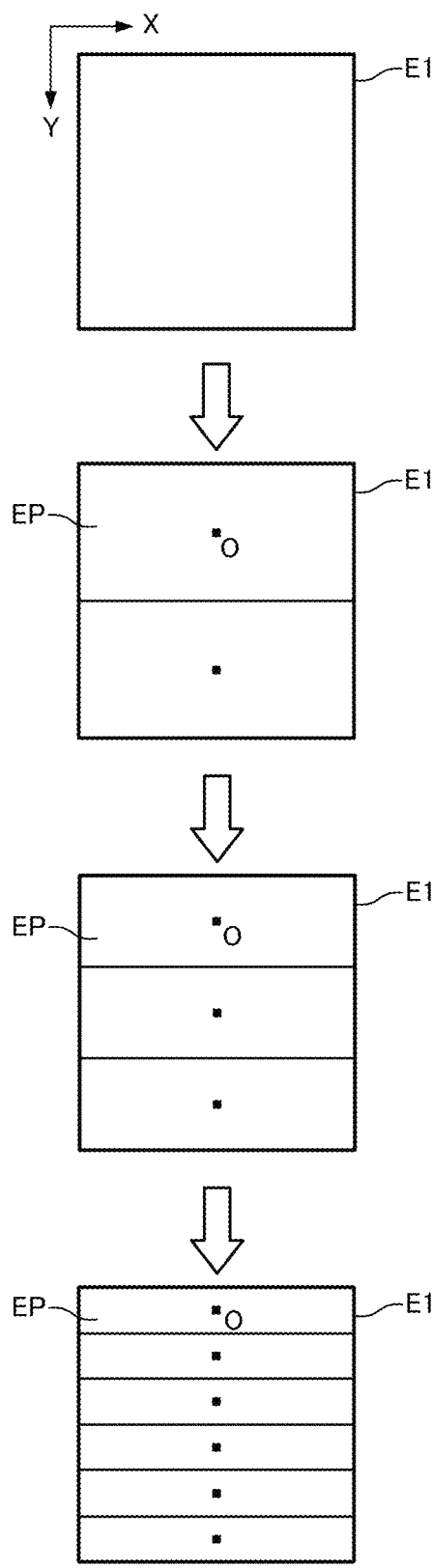
FIG. 21 is a diagram for describing a modification of processing of dividing an electron image.

FIG. 21 is a diagram for describing a modification of the processing of dividing an electron image.

In the above example indicated in FIG. 9, the first electron image E1 is divided by 2 in the X direction and is divided by 2 in the Y direction, creating a total of four partial image EPs. Then the first electron image E1 is divided by 3 in the X direction and is divided by 3 in the Y direction, creating a total of nine partial image EPs. Then the first electron image E1 is divided by 6 in the X direction and is divided by 6 in the Y direction, creating a total of 36 partial image EPs. In this way, in the case of the example in FIG. 9, a number of divisions in the X direction and a number of divisions in the Y direction are the same. Here the X direction is a direction of scanning with an electron probe, and the Y direction is a direction orthogonal to the scanning direction.

In the example indicated in FIG. 21, on the other hand, the first electron image E1 is divided by 2 in the Y direction to create two partial image EPs first, then the first electron image E1 is divided by 3 in the Y direction to create three partial image EPs, and then the first electron image E1 is divided by 6 in the Y direction to create six partial image EPs.

In this way, in the case of the example in FIG. 21, the first electron image E1 is divided only in the Y direction, and not in the X direction. This is because compared with the Y direction, the influence of specimen drift is quite minor in the X direction, since the X direction is the direction of scanning with an electron probe.

In the case of the example in FIG. 21, the first electron image E1 is not divided in the X direction, but may be divided in the X direction by a number smaller than in the Y direction.

4.3. Modification 3

In the above embodiment, the positional deviation of the X-ray map is corrected using the positional deviation amount of the electron image, but the target image of the correction is not limited to the X-ray map. For example, the target image of the correction may be a cathode luminescence image, an absorption current image, a secondary electron image, a back-scattered electron image, an Auger electron image, or the like.

4.4. Modification 4

In the above embodiment, the positional deviation of the X-ray map is corrected using the positional deviation amount of the electron image, but the positional deviation amount may be calculated using an image that is acquired by detecting signals of which signal amount is higher than the X-ray, and the positional deviation of the X-ray map may be corrected using this calculated positional deviation amount.

4.5. Modification 5

In the above embodiment, a case where the analyzer is an EPMA was described, but the analyzer according to the invention is not limited to an EPMA. The analyzer according to the invention may be any apparatus that can acquire map data and image data of various signals of electrons, X-rays, and the like. For example, the analyzer according to the invention may be a scanning electron microscope, an Auger electron microscope, or a fluorescence X-ray spectrometer.

The above-described embodiments and modifications are examples, and the invention is not limited thereto. For example, the embodiments and the modifications may be combined appropriately.

The invention is not limited to the above-described embodiments, and various modifications can be made. For example, the invention includes configurations that are substantially the same as the configurations described in the embodiments. Substantially same configurations means configurations having the same functions, methods and results, or configurations having the same objectives and effects as those of the configurations described in the embodiments, for example. The invention also includes configurations obtained by replacing non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An analyzer comprising:
an analyzer main body that measures a specimen; and
an image processing unit that processes images based on a result of measurement of the specimen,
the image processing unit performing processing of:
acquiring a reference image which is obtained by measuring an analysis target region of the specimen by the analyzer main body;
acquiring a measurement image which is obtained by measuring the analysis target region by the analyzer main body;
dividing the measurement image into a plurality of partial measurement images, and dividing the reference image into a plurality of partial reference images;
calculating a positional deviation amount of each of the partial measurement images relative to a corresponding partial reference image among the partial reference images;
determining whether the positional deviation amount is a threshold or less; and
correcting positional deviation of the measurement image based on the positional deviation amounts of the plurality of partial measurement images when the image processing unit has determined that the positional deviation amount is not the threshold or less,
the processing of dividing, the processing of calculating the positional deviation amount, the processing of determining, and the processing of correcting the positional deviation being repeated until the image processing unit determines that the positional deviation amount is the threshold or less, and
the processing of dividing for an Mth time comprising processing of:
determining whether a size of each of the partial measurement images in the processing of dividing for an M−1th time is a reference size or less;
making a size of each of the partial measurement images in the processing of dividing for the Mth time to be smaller than the size of each of the partial measurement images in the processing of dividing for the M−1th time when the image processing unit has determined that the size of each of the partial measurement images for the M−1th time is not the reference size or less; and
making an overlapping amount of adjacent partial measurement images among the plurality of partial measurement images to be larger than the overlapping amount in the processing of dividing for the M−1th time when the image processing unit has determined that the size of each of the partial measurement images for the M−1th time is the reference size or less.

2. The analyzer according to claim 1, wherein
the image processing unit performs processing of creating a correction table which is used for correcting the positional deviation of the measurement image based on the positional deviation amounts of the plurality of partial measurement images.

3. The analyzer according to claim 2, wherein
the analyzer main body comprises:
an electron optical system that illuminates the specimen with an electron beam;
an electron detector that detects electrons emitted from the specimen illuminated with an electron beam; and
an X-ray detector that detects an X-ray emitted from the specimen illuminated with an electron beam,
the reference image and the measurement image are electron images acquired by detecting electrons by the electron detector,
the analyzer main body acquires an X-ray image acquired by detecting an X-ray by the X-ray detector simultaneously with the electron images, and
the image processing unit uses the correction table to perform processing of correcting positional deviation of the X-ray image acquired simultaneously with the measurement image.

4. The analyzer according to claim 1, wherein
the processing of calculating the positional deviation amount comprises processing of:
calculating, in each of the plurality of partial measurement images, a positional deviation amount of a center of each of the partial measurement image from a center of the corresponding partial reference image; and
calculating, positional deviation amounts of a plurality of pixels constituting the adjacent partial measurement images based on positional deviation amounts of centers of the adjacent partial measurement images.

5. The analyzer according to claim 1, wherein
the measurement image is an image generated by scanning the specimen with an electron beam, detecting electrons emitted from each measurement point, and imaging a distribution of electron intensity.

6. An image processing method comprising steps of:
acquiring a reference image by measuring an analysis target region of a specimen by using an analyzer;
acquiring a measurement image by measuring the analysis target region by using the analyzer;
dividing the measurement image into a plurality of partial measurement images, and dividing the reference image into a plurality of partial reference images;
calculating a positional deviation amount of each of the partial measurement images relative to a corresponding partial reference image among the partial reference images;
determining whether the positional deviation amount is a threshold or less; and
correcting positional deviation of the measurement image based on the positional deviation amounts of the plurality of partial measurement images when it has been determined that the positional deviation amount is not the threshold or less, the step of dividing, the step of calculating the positional deviation amount, the step of determining, and the step of correcting the positional deviation being repeated until it is determined that the positional deviation amount is the threshold or less, and the step of dividing for an Mth time comprising:

determining whether or not a size of each of the partial measurement images in the step of dividing for an M−1th time is a reference size or less;

making a size of each of the partial measurement images in the step of dividing for the Mth time to be smaller than the size of each of the partial measurement images in the step of dividing for the M−1th time when it has been determined that the size of each of the partial measurement images is not the reference size or less; and making an overlapping amount of adjacent partial measurement images among the partial measurement images to be larger than the overlapping amount in the step of dividing for the M−1th time when it has been determined that the size of each of the partial measurement images is the reference size or less.

* * * * *